US009607672B2

(12) United States Patent
Lin et al.

(10) Patent No.: US 9,607,672 B2
(45) Date of Patent: Mar. 28, 2017

(54) MANAGING SKEW IN DATA SIGNALS WITH ADJUSTABLE STROBE

(71) Applicant: Cavium, Inc., San Jose, CA (US)

(72) Inventors: David Lin, Westborough, MA (US); Edward Wade Thoenes, Cambridge, MA (US)

(73) Assignee: Cavium, Inc., San Jose, CA (US)

( * ) Notice: Subject to any disclaimer, the term of this patent is extended or adjusted under 35 U.S.C. 154(b) by 46 days.

(21) Appl. No.: 14/672,787

(22) Filed: Mar. 30, 2015

(65) Prior Publication Data

US 2016/0141013 A1    May 19, 2016

Related U.S. Application Data

(63) Continuation-in-part of application No. 14/542,202, filed on Nov. 14, 2014.

(51) Int. Cl.

| G11C 7/00 | (2006.01) |
|---|---|
| G11C 7/22 | (2006.01) |
| G11C 7/10 | (2006.01) |
| G11C 29/02 | (2006.01) |
| G11C 29/50 | (2006.01) |
| G06F 13/16 | (2006.01) |

(52) U.S. Cl.
CPC ............ *G11C 7/22* (2013.01); *G06F 13/1689* (2013.01); *G11C 7/10* (2013.01); *G11C 7/1066* (2013.01); *G11C 7/1093* (2013.01); *G11C 29/023* (2013.01); *G11C 29/028* (2013.01); *G11C 29/50012* (2013.01)

(58) Field of Classification Search
CPC ..................... G11C 11/4094; G11C 11/4076
See application file for complete search history.

(56) References Cited

U.S. PATENT DOCUMENTS

| 7,209,531 B1 | 4/2007 | Katz et al. |
|---|---|---|
| 8,081,527 B1 | 12/2011 | Venkataraman et al. |
| 9,349,434 B1 | 5/2016 | Lin et al. |
| 2003/0117864 A1 | 6/2003 | Hampel et al. |
| 2003/0122696 A1 | 7/2003 | Johnson et al. |
| 2007/0282555 A1 | 12/2007 | Chong et al. |
| 2009/0168559 A1 | 7/2009 | Seo |
| 2009/0276559 A1 | 11/2009 | Allen, Jr. et al. |
| 2010/0008158 A1 | 1/2010 | Swain et al. |
| 2012/0206181 A1 | 8/2012 | Lin et al. |
| 2013/0141994 A1 | 6/2013 | Ito et al. |
| 2014/0321229 A1 | 10/2014 | Duffner |
| 2015/0012718 A1 | 1/2015 | Gupta et al. |
| 2015/0103608 A1 | 4/2015 | Miyano et al. |

(Continued)

*Primary Examiner* — Richard Elms
*Assistant Examiner* — Mohammed A Bashar
(74) *Attorney, Agent, or Firm* — Occhiuti & Rohlicek LLP

(57) ABSTRACT

An apparatus for controlling memory includes a memory controller, and a data interface that interfaces with and is in data communication with data lines, each having inherent skew. Each data line carries a data signal. The data lines connect the memory controller to the memory. The apparatus also includes data de-skewers, each associated with a corresponding data line, a strobe interface that interfaces with a strobe line that connects the memory controller to the memory and that applies a timing signal to the strobe line, and a strobe de-skewer connected to the strobe line. Each data de-skewer operates in read or write mode. A particular data line's data de-skewer applies a compensation skew to a data signal carried by that line.

17 Claims, 16 Drawing Sheets

(56) References Cited

U.S. PATENT DOCUMENTS

| | | |
|---|---|---|
| 2015/0109034 A1 | 4/2015 | Vasudevan et al. |
| 2016/0141012 A1 | 5/2016 | Lin et al. |
| 2016/0141018 A1 | 5/2016 | Lin et al. |

|  | DQ Bit 0 | DQ Bit 1 | DQ Bit 2 | DQ Bit 3 | DQ Bit 4 | DQ Bit 5 | DQ Bit 6 | DQ Bit 7 |
|---|---|---|---|---|---|---|---|---|
| DQ WDSK Setting 0% | FAIL | PASS | FAIL | FAIL | FAIL | FAIL | PASS | PASS |
| DQ WDSK Setting 12.5% | PASS | PASS | PASS | FAIL | FAIL | PASS | PASS | PASS BEST |
| DQ WDSK Setting 25% | PASS | PASS | PASS | FAIL | PASS | PASS BEST | PASS BEST | PASS |
| DQ WDSK Setting 37.5% | PASS BEST | PASS BEST | PASS BEST | PASS | PASS BEST | PASS | PASS | PASS |
| DQ WDSK Setting 50% | PASS | PASS | PASS | PASS BEST | PASS | PASS | PASS | FAIL |
| DQ WDSK Setting 62.5% | PASS | PASS | PASS | PASS | PASS | FAIL | FAIL | FAIL |
| DQ WDSK Setting 75% | FAIL | PASS | PASS | FAIL | FAIL | FAIL | FAIL | FAIL |
| DQ WDSK Setting 87.5% | FAIL | PASS | FAIL | FAIL | FAIL | FAIL | FAIL | FAIL |

*FIG. 4*

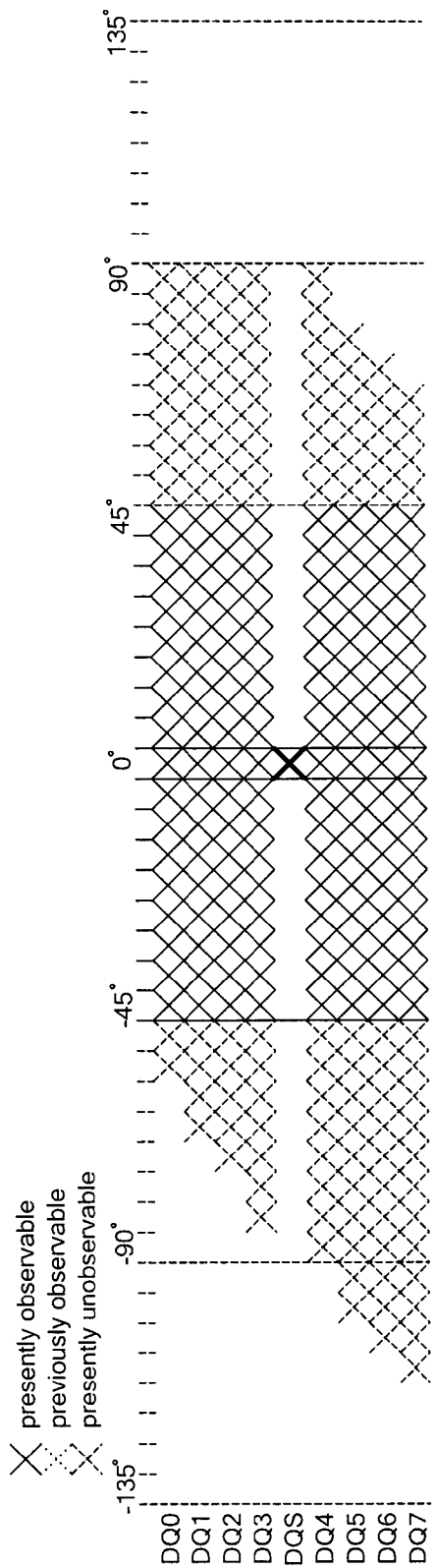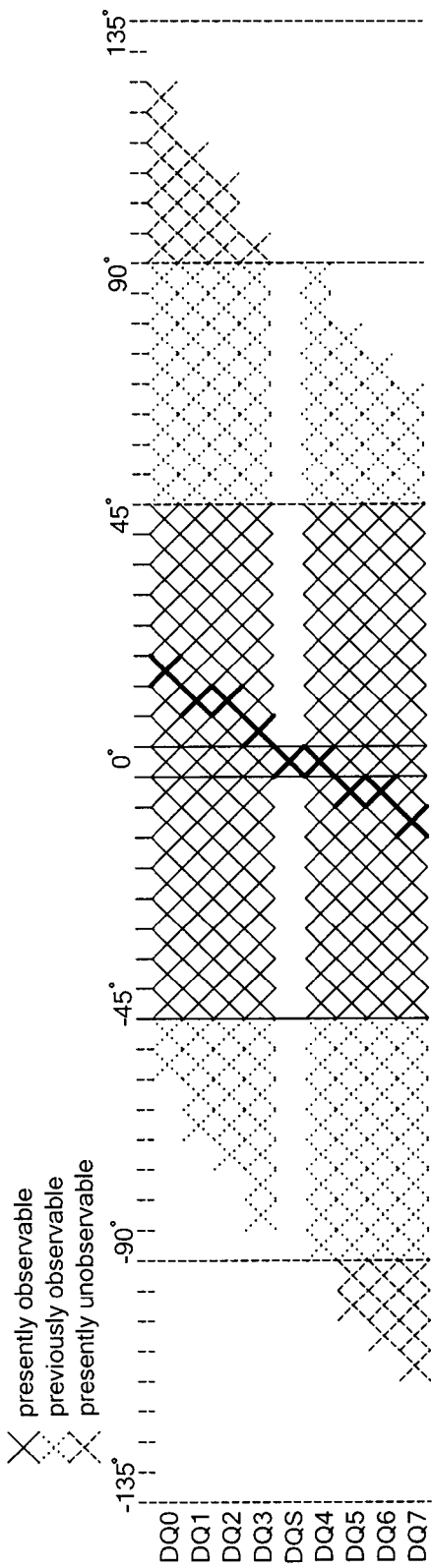

MANAGING SKEW IN DATA SIGNALS WITH ADJUSTABLE STROBE

CROSS-REFERENCE TO RELATED APPLICATIONS

This application is a continuation-in-part of and claims the benefit of the Nov. 14, 2014 priority date of U.S. application Ser. No. 14/542,202, filed on Nov. 14, 2014, the content of which is incorporated herein by reference.

BACKGROUND

This application relates to memory controllers, and in particular, to managing skew in data signals, using multiple modes.

In a typical memory system, a memory and a memory controller connect to a common bus that has several parallel wires. Each wire, which carries one bit, will be referred to herein as a "data line."

The signal present on each data line represents data. It will therefore be referred to herein as the "data signal." In a typical memory with eight-bit bytes, there would be eight of these data signals for every byte.

In a typical memory system, the wires that carry a byte include data lines, with one data line for each bit. Thus, for an eight-bit byte, there would be eight data lines. However, there is also an extra pair of wires. This extra wire pair carries a differential signal that functions as a reference clock for sampling the data lines. The differential signal carried by these extra wires is often called a "strobe" or a "timing signal." The wires that carry this timing signal are collectively called a "strobe line."

For example, such a memory system may include a memory controller for a memory module that includes a number of synchronous dynamic random access (SDRAM) memory chips. In such a system the data line may be called a "DQ" signal, and the strobe may be called a "DQS" signal.

In the process of writing to the memory, a memory controller receives several n-bit units worth of data, together with an instruction to write those units into the memory. Each unit has n data bits and an associated strobe line. For each n-bit unit, the controller places each of the n bits on each of the n individual data lines corresponding to those n bits. As part of this task, the memory controller places a strobe on the strobe line for each n-bit unit. For each n-bit unit, the memory makes use of the strobe to sample the data lines for that unit, and stores the corresponding data into the memory array. In some embodiments, n=8. However, in other embodiments n=4.

The data lines may be bidirectional. So, in the process of reading from the memory, the controller issues one or more commands to the memory. In response, the memory places data signals on the data lines and a corresponding strobe on the strobe line. The controller then retrieves the data from the bidirectional data lines.

In the ideal case, the timing of the strobe and the data signals should be maintained with a particular relative phase offset while propagating between the controller and the memory. However, in practice, different data lines have different skews in the data signals. These different skews, which result in different relative phase offsets, arise as a result of variations in the path-lengths of the routes followed by the data signals as they traverse the package that contains a memory component, a module containing multiple packaged memory components, a printed circuit board that connects the controller to the memory module, and the package of the memory controller. For example, temperature may also cause such variations. As a result of higher data rates, the effects of these variations are more significant.

SUMMARY

In one aspect, the invention features an apparatus for controlling a memory. Such an apparatus includes a memory controller, and a data interface that interfaces with and is in data communication with data lines, each of which has an inherent skew. Each data line carries a data signal. The data lines connect the memory controller to the memory. The apparatus also includes data de-skewers, each of which is associated with a corresponding one of the data lines, a strobe interface that interfaces with a strobe line that connects the memory controller to the memory and that applies a timing signal to the strobe line, and a strobe de-skewer that is in communication with the strobe line. Each data de-skewer operates in a write mode and in a read mode. In the write mode, a bit is to be written to the memory. In the read mode, a bit is to be read from the memory. The data de-skewer that corresponds to a particular data line is configured to apply a compensation skew to a data signal that is carried by that data line. When the data de-skewer is operated in the write-mode, the data signal represents a bit that is to be written to the memory. When the data de-skewer is operated in read mode, the data signal represents a bit that has been read from the memory.

Embodiments include those in which the strobe de-skewer skews the timing signal by a timing-signal skew that depends at least in part on the inherent skews, those in which the strobe de-skewer skews the timing signal by a timing-signal skew selected to be as close as possible to one half of a difference between the maximum delay of the de-skewer and the minimum delay of the de-skewer, and those in which the strobe de-skewer skews the timing signal by a timing-signal skew selected to be equal to one half of a difference between the maximum delay of the strobe de-skewer and the minimum delay of the strobe de-skewer.

Also among the embodiments are those in which the data lines comprise a first data line having an associated first data de-skewer that defines a first observation window. In these embodiments, the first data line carries a first data signal that has a first data-valid window. The strobe de-skewer skews the timing signal by a timing-signal skew that has been selected based at least in part on an extent to which the first data-valid window extends into the first observation window.

In other embodiments, the strobe de-skewer skews the timing signal by a timing-signal skew that has been selected to reduce a collective sampling error. In these embodiments, the data lines comprise a first data line and a second data line. The first data line carries a first data signal that has a first data-valid window having a first data-valid-window center. The first data line is sampled at a first sample point such that a distance between the first sample point and the first data-valid-window center defines a first offset. Meanwhile, the second data line carries a second data signal that has a second data-valid window having a second data-valid-window center. The second data line is sampled at a second sample point such that a distance between the second sample point and the second data-valid-window center defines a second offset. The collective sampling error is a function of an extent to which each of the data signals is sampled at a center of a data-valid window thereof.

Further embodiments include those in which the strobe de-skewer skews the timing signal by a timing-signal skew that has been selected based at least in part on the compensation-skews applied to each of the data signals by the data de-skewers, and those in which the strobe de-skewer skews the timing signal by a timing-signal skew that has been selected based at least in part on a failure to detect an edge, the edge being either a trailing edge of a data signal, or a leading edge of the data signal.

Yet other embodiments include those in which the strobe de-skewer skews the timing signal by a timing-signal skew that has been selected based at least in part on a particular set of compensation skews that have been selected for the data de-skewers. In these embodiments, the particular set of skews that have been selected for the data de-skewers were selected to cause each data signal to be sampled as closely as possible to a first delay stage of a data de-skewer associated with the data signal subject to the constraint that no data signal be skewed far enough to cause a data-valid window thereof to leave an observation window of a data de-skewer.

In yet another aspect, the invention features a method of controlling a memory. Such a method includes receiving a data signals on corresponding data lines, each of which has an inherent skew, selecting compensation skews, each of which corresponds to one of the data lines, and applying each of said compensation skews to a data signal that is being carried by a corresponding one of said data lines. The data signal in each case is either a bit that has been read from the data line, when operating in read mode, or a bit that is to be written to the data line, when operating in write mode. The method further includes selecting a timing-signal skew to apply to said timing signal and skewing the timing signal by that selected timing-signal skew. The timing-signal skew is selected from a range that extends from a maximum delay of a strobe de-skewer to a minimum delay of said strobe de-skewer.

In some practices, selecting a timing-signal skew to apply to the timing signal includes selecting a timing-signal skew that depends at least in part on the inherent skews.

Other practices include those in which selecting a timing-signal skew to apply to the timing signal includes selecting a timing-signal skew to be as close as possible to one half of a difference between the maximum delay of the de-skewer and the minimum delay of the de-skewer, those in which selecting a timing-signal skew to apply to the timing signal includes selecting a timing-signal skew to be equal to one half of a difference between the maximum delay of the strobe de-skewer and the minimum delay of the strobe de-skewer, and those in which selecting a timing-signal skew to apply to the timing signal includes selecting the timing-signal skew based at least in part on an extent to which a first data-valid window of a first data signal from the plurality of data signals extends into a first observation window of a first data de-skewer on a data line that carries the first data signal.

Also included are practices in which skewing the timing signal by the timing-signal skew includes skewing the timing-signal by a timing-signal skew that has been selected based at least in part on a particular optimal compensation vector, and those in which skewing the timing signal includes skewing the timing signal by a timing-signal skew that has been selected to reduce a collective sampling error. Among these are practices that further include defining the collective sampling error based at least in part on an extent to which each of the data signals is sampled at a center of a data-valid window thereof.

In alternative practices, selecting a timing-signal skew to apply to the timing signal includes selecting the timing-signal skew based at least in part on a failure to detect an edge that is either a trailing edge or a leading edge of a data signal.

Yet other practices includes those in which selecting compensation skews includes selecting the compensation skews to cause each data signal to be sampled as closely as possible to a first delay stage of a data de-skewer associated with the data signal subject to the constraint that no data signal be skewed to an extent that causes a data-valid window thereof to leave an observation window of the data de-skewer. In these practices, selecting a timing-signal skew to apply to the timing signal includes selecting the timing-signal skew based at least in part on the particular set of skews.

These and other features of the invention will be apparent from the following description and the accompanying drawings.

BRIEF DESCRIPTION OF THE DRAWINGS

FIG. 4 shows the derivation of a compensation vector to be used for compensation of the bits in FIG. 1.

FIG. 16 shows uncompensated data signals that are initially more closely aligned than those in FIG. 8.

FIG. 17 shows, for each data signal in FIG. 16, the center of the valid portion based on what is visible.

DETAILED DESCRIPTION

Figure 1:
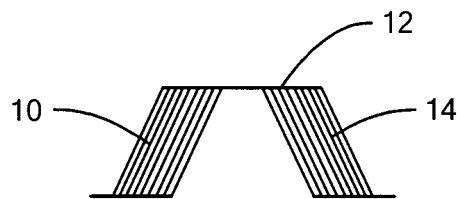
FIG. 1 shows several bits overlaid on each other to show a data-valid window.

FIG. 1 shows a superposition of bits from a data unit after having been placed on respective data lines by a controller and having reached a memory. The particular example shows a data unit with eight bits. However, the principles described herein are independent of the actual number of bits.

The superposition of bits that is shown in FIG. 1 has three intervals: a leading-transition interval 10 during which the bits are potentially transitioning between different values, a data-valid window 12 during which all bits are held at their correct values, and a trailing-transition interval 14 during which the bits are also potentially transitioning between different values.

In the example of FIG. 1, for illustration purposes, all n bits happen to transition from low to high and then from high back to low. This corresponds to a bit sequence of 010 for all n bits.

In the example of FIG. 1, the terms "leading" and "trailing" are relative to a time slot for a particular bit. The trailing-transition interval of one bit is the same as the leading-transition interval of the subsequent bit.

It is apparent from the FIG. 1 that the individual bits are not perfectly aligned. This misalignment is called a "skew." As a result of this misalignment, the extent of each of these intervals is not the same across all data lines. Some data lines reach their data-valid window 12 earlier than others. Other data lines may start their trailing-transition interval 14 sooner than most. This tends to broaden the aggregate leading-transition interval 10 and the aggregate trailing-transition interval 14 of the collection of bits as a whole. This broadening comes at the expense of what has now become a shorter aggregate data-valid window 12.

A timing signal identifies when these bits will be sampled. Clearly, it would not be a good idea to sample the bits during the leading-transition interval 10 or the trailing-transition interval 14. This is because the values of the bits would not be clearly defined. The best time to sample valid values for all of the bits is while all n data lines are still in their respective data-valid windows 12. It is therefore desirable to have a timing signal that occurs sometime during the data-valid window 12. Such a timing signal will ensure that all bits are in a state suitable for sampling.

Given the technological limits on how short the transitions of the leading-transition interval 10 and trailing-transition interval 14 can be, as clock rates have become faster, the data-valid window 12 has become shorter. Thus, it has become easier for the timing signal to miss the data-valid window 12. This can result in inadvertently sampling one or more bits during the leading-transition or trailing-transition interval 10, 14 when a signal is not guaranteed to be at its correct value.

A solution to this difficulty is to de-skew the individual data signals so as to reduce the extent of the aggregate leading-transition and trailing-transition intervals 10, 14, thus extending the aggregate data-valid window 12. This would be followed by adding a skew that is required by the receiving memory between all n data bits and the strobe. The extent of the relative skew is selected to maximize the likelihood of having the memory sample the data lines during the extended aggregate data-valid window 12 thus created. In the preferred embodiment, the relative skew is caused by skewing the data relative to a fixed strobe. Another embodiment could use a variable strobe-skew and increase the total range by up to two times for some skew patterns.

A signal's timing can be controlled by passing the signal through a delay line. A delay-line has multiple delay stages $u_1, u_2, \ldots u_N$, each of which yields an output that is a delayed version of the input. The extent of this delay monotonically increases with the index 1, 2, . . . N of the delay stage. To delay the signal by a particular amount, one selects an appropriate delay stage and obtains the delayed signal from the final output.

Each one of the data signals shown in FIG. 1 has an inherent skew that governs when the data-valid window 12 for that data signal begins. This skew varies from one bit to the next. Although the inherent skew cannot easily be eliminated, it can nevertheless be compensated for.

The method and apparatus disclosed herein de-skews the individual data signals shown in FIG. 1 by identifying a set of compensation-skews such that the sum of a data signal's inherent skew and its compensation-skew is substantially the same for each data signal. As a result, the aggregate data-valid window 12 will increase and the aggregate leading-transition and trailing-transition intervals 10, 14 will decrease. The process of identifying these compensation-skews is carried out during a training procedure. This might occur, for example, when a computer is first turned on or rebooted. Once the compensation-skews for each bit have all been determined, they are stored (e.g., in registers) for use during an operating procedure.

In some embodiments, the process begins by passing the strobe, or timing signal, through a delay line and skewing it by an amount that is about midway across the range of the delay line. In other words, if the delay line applies a maximum delay of $t_{max}$ and a minimum delay of $t_{min}$, then the strobe is skewed by about $0.5*(t_{max}-t_{min})$.

Figure 2:
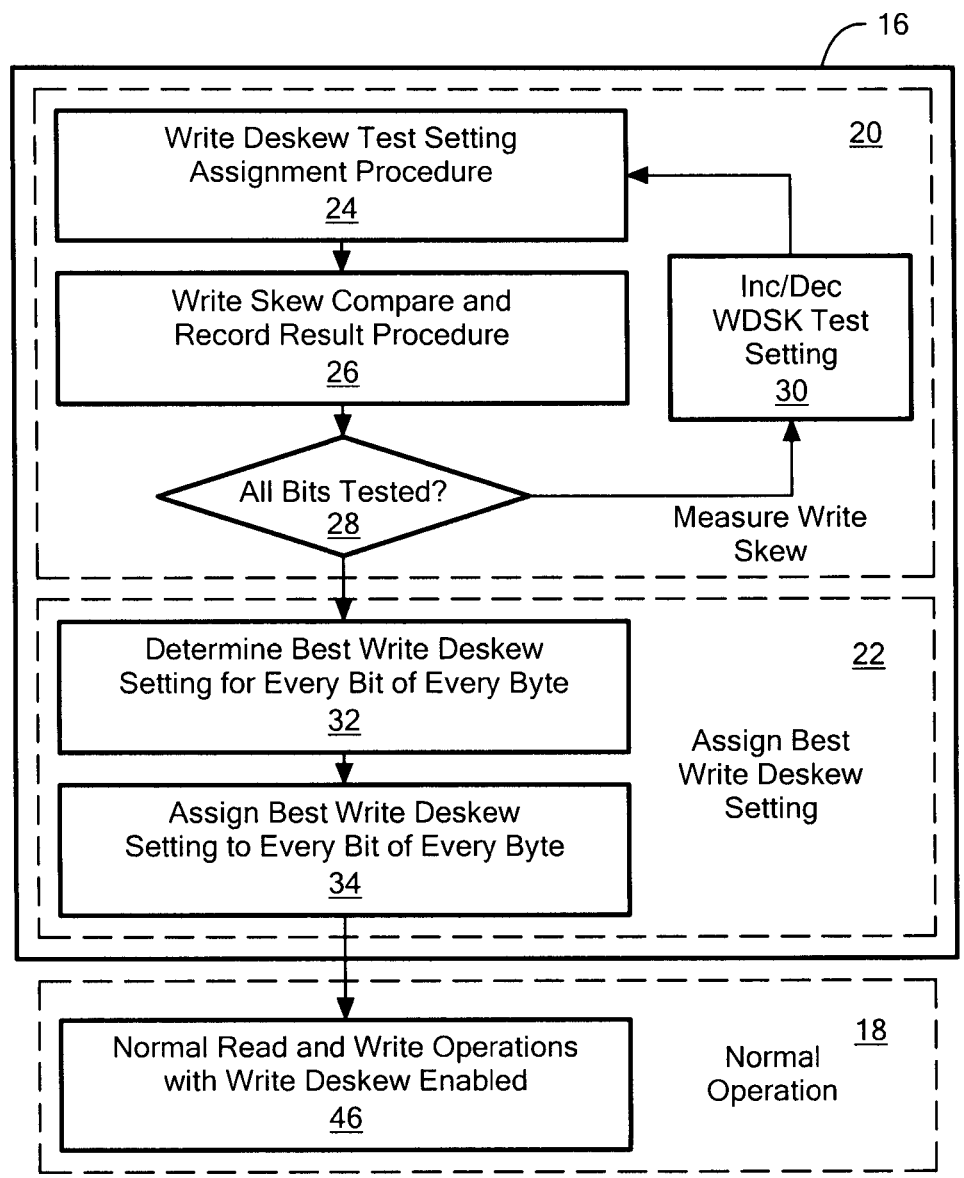
FIG. 2 shows a flow chart for carrying out a write-skewing procedure to ensure sampling during the data-valid window shown in FIG. 1.

Referring now to FIG. 2, an example of a write-de-skewing process includes a training procedure 16 and an operating procedure 18. The training procedure 16 breaks down into a measurement phase 20 and an assignment phase 22.

The measurement phase 20 includes, for each bit, sweeping across a range of compensation-skews to identify an optimal compensation-skew for that bit. In particular, the measurement phase 20 includes choosing a particular compensation-skew (step 24), applying that compensation-skew, and comparing a bit value written to the memory with a bit value read back from the memory (step 26) to see if it results in a write error. After repeating this procedure for all bits (step 28), a new compensation-skew is obtained by incrementing or decrementing the old one (step 30). The procedure then begins all over again with the new compensation-skew. This procedure can be performed for multiple bytes of a memory interface concurrently. For example, bit 0 of all bytes can be tested at the same time, then bit 1 of all bytes can be tested, etc. Also, in some embodiments, instead of repeating the procedure sequentially for each bit of a byte, the error for all bits of all bytes is analyzed in parallel.

The measurement phase 20 includes, for each value of compensation-skew, causing each bit to be written into memory and then reading the bit back. If the value read back is consistent with the value written, then that compensation-skew is identified as one of several possible choices for the optimal compensation-skew that could be applied to that bit. This process is carried out in parallel for all bits. Expressed in pseudo-code, an example of this procedure is as follows:

```
FOR I=1..NBITS
    FOR J=1..NSKEWS
        TIME=0
        AT (TIME=J*SKEW_STEP)
        WRITE(BIT(I),MEMORY_LOCATION)
        X=READ(MEMORY_LOCATION)
        IF (X==BIT(I)) THEN WRITE (J,GOOD_LIST)
```

NEXT J
NEXT I

The outer "FOR" loop is only shown for clarity. In practice, this procedure is carried out in parallel for all bits.

The assignment phase 22 includes examining the set of candidate passed compensation-skews. The "passed compensation-skews" are those compensation-skews in which the test was passed. This examination determines the optimal compensation-skew for each bit (step 32). These optimal compensation-skews are then assigned to each bit (step 34), thus completing the training procedure 16.

Figure 3:
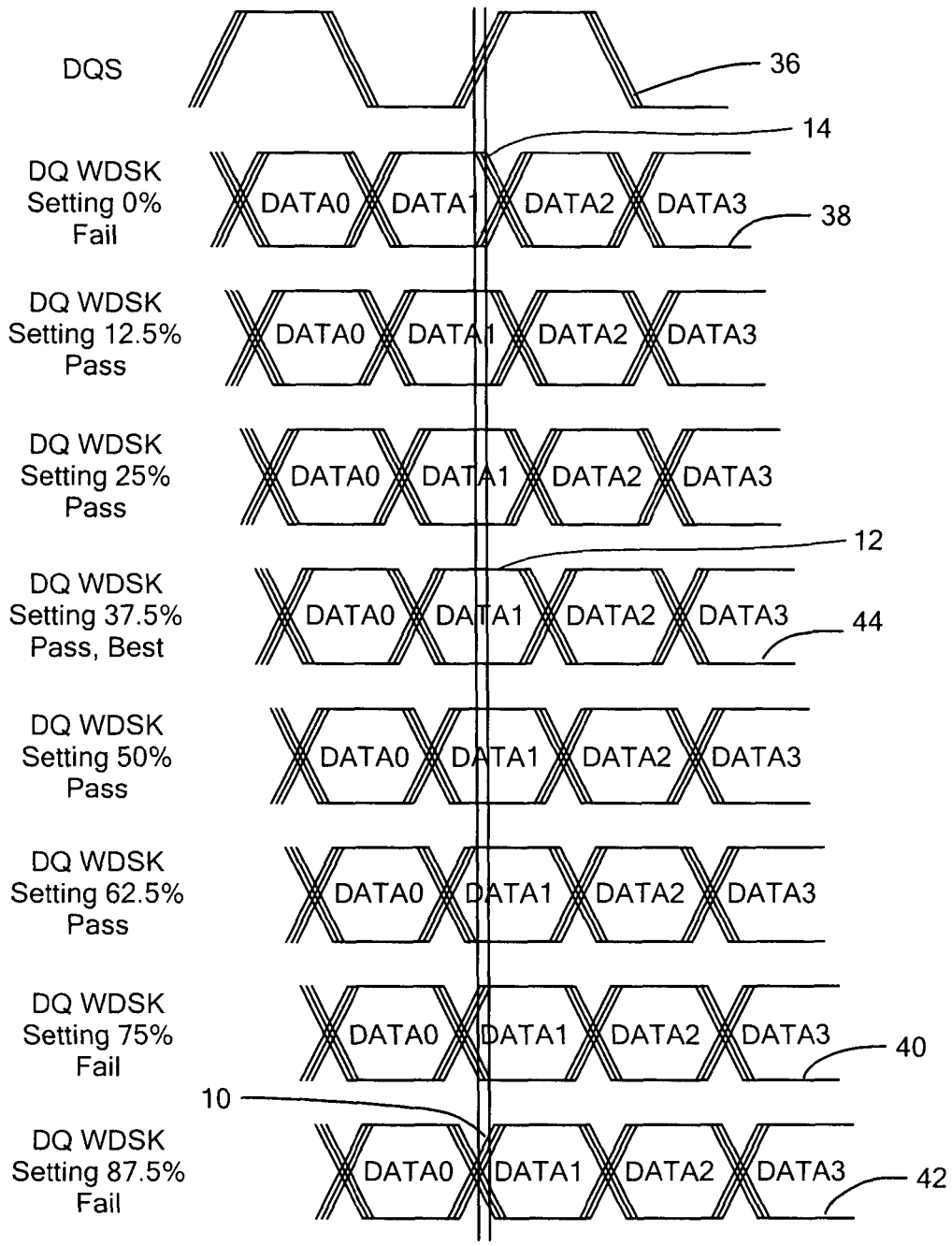
FIG. 3 shows sweeping across compensation-skew settings to identify optimal compensation-skew settings to enlarge the data-valid window shown in FIG. 1.

FIG. 3 illustrates the process of sweeping across the various delay settings for a first bit, as discussed in connection with the measurement phase (step 20). The topmost waveform shows a timing signal, or strobe 36. This strobe 36 has been delayed by the strobe-skew defined above. The remaining eight waveforms correspond to eight settings on a delay line.

As is apparent, in a first skew setting 38, in which the data signal has sustained a compensation-skew of 0% of the total compensation range of the delay line, the rising edge of the strobe 36, in this example, is close to the trailing-transition interval 14. In the seventh, and eight skew settings 40, 42, where the data signal has sustained compensation-skews of 75% and 87.5% of the total compensation range of the delay line, the rising edge of the strobe 36 is now close to the leading-transition interval 10. Both of these skew settings result in reading a value that is inconsistent with what was written. According to FIG. 3, the best compensation-skew to apply to the first bit would be the fourth skew setting 44, which is 37.5% of the total compensation range of the delay line.

The fact that the optimal skew setting for the first bit is the fourth skew setting 44 says nothing about what the optimal skew settings might be for the other seven bits. In fact, FIG. 4 shows an example of the optimal skew settings for the first bit and the remaining seven bits. As is apparent, many of the bits are optimized by the fourth skew setting 44. However, there are some outliers. For instance, bit 7 is optimized by the second skew setting.

The result of the training procedure 16 is thus an eight-dimensional optimal compensation vector (or "de-skewing vector"), which in the case shown in FIG. 4 is [4 4 4 5 4 3 3 2]. The optimal compensation vector is then saved and applied for use in operating procedure 18.

During the operating procedure 18, normal reading and writing operations occur but with the write-skew feature enabled (step 46). The compensation-skew for each bit is stored in a register associated with that bit. The compensation-skew for a particular bit is then applied to that bit every time a write is to occur. Then, once the bits have all been placed on their respective data lines, the strobe 36 is placed on the strobe line after the lapse of the strobe-skew.

A method and apparatus for using a de-skewer for de-skewing data signals that are being read from a memory is described in U.S. patent application Ser. No. 14/046,879, filed on Oct. 4, 2013, the contents of which are herein incorporated by reference. The method and apparatus disclosed herein re-uses the same de-skewer that is used for de-skewing data signals that are being read from the memory for de-skewing data signals that are to be written to the memory. The de-skewer can be trained separately for reading and writing. Alternatively, a training re-use mode has the advantage of enabling a de-skewing vector determined for reading to be re-used for writing as well as reading, as described in more detail below.

Figure 7:
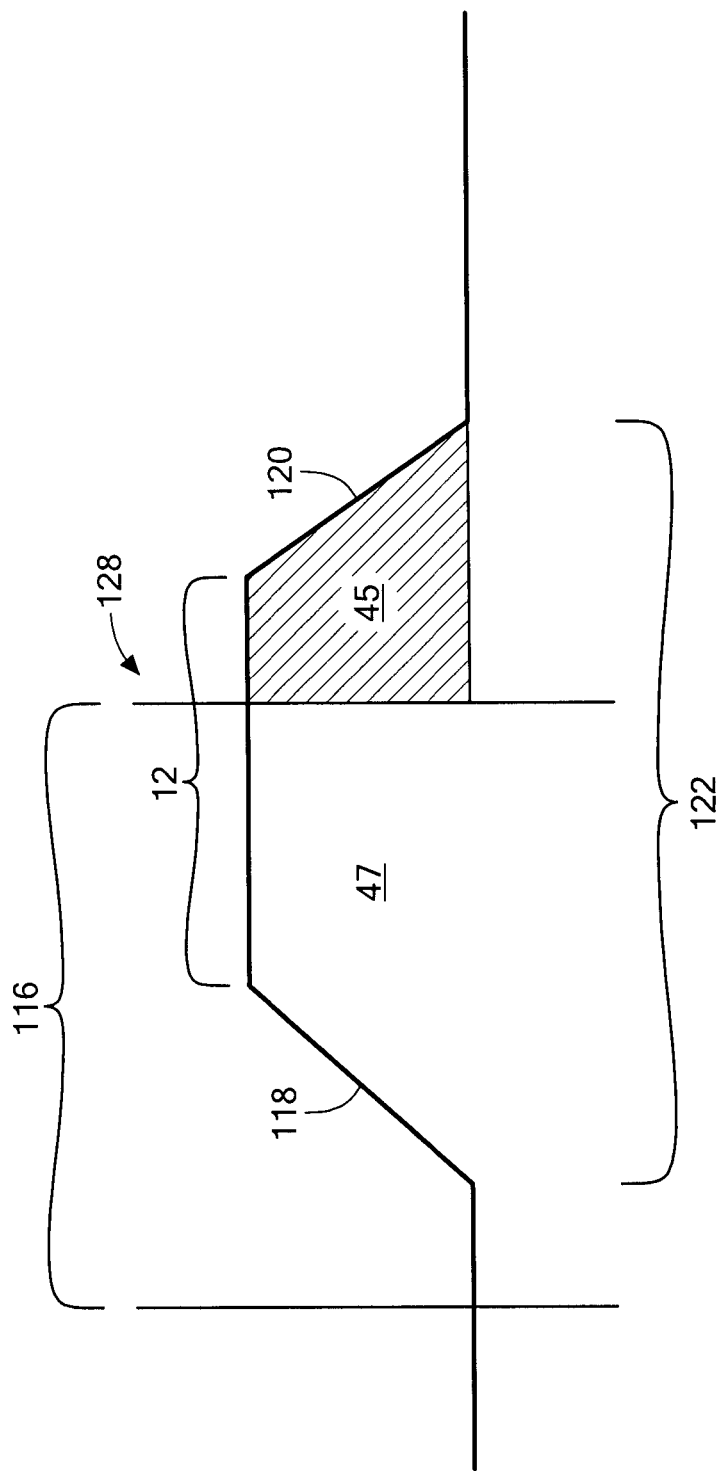
FIG. 7 shows visible and invisible portions of a data signal.

Referring to FIG. 7, for a particular one of the data signals 122, the procedure set forth in connection with FIG. 3 will identify a compensation-skew that will tend to center the data-valid window 12 of the data signal 122 relative to the strobe 36. The procedure works by sweeping across all possible compensation-skews in an attempt to find a leading edge 118 and a trailing edge 120 of the data signal 122. Once the leading edge 118 and the trailing edge 120 of the data signal 122 have been found, the center of the data-valid window 12 can be derived. It therefore becomes possible to center each data signal 122 relative to the strobe 36 using a compensation-skew that is appropriate to that data signal 122.

The foregoing method presupposes that the leading and trailing edges 118, 120 of the data signal 122 can, in fact, be found. If one or the other is not known, the center of the data signal 122 cannot be found.

A delay-line has only a finite number of delay stages $u_1$, $u_2$, . . . $u_N$, each of which yields an output that is a delayed version of the input. As a result, the set of all possible compensation-skews spans a temporally finite observation window 116, shown in FIG. 7. It is possible for a leading edge 118 or a trailing edge 120 of a data signal 122 to fall outside this observation window 116.

In some delay lines, a delay stage corresponds to zero delay. Selecting this delay stage effectively provides a way to simply bypass the delay-line.

A data signal 122 that does not fall completely inside the observation window 116 would be divided into a visible portion 47 and an invisible portion 45. Since the trailing edge 120 shown in FIG. 7 falls into the invisible portion 45, it can never be found.

In the procedure described thus far, anything outside the observation window 116 is simply ignored. As a result, the strobe 36 will sample the data signal 122 midway between its leading edge 118 and the trailing edge 128 of the visible portion 116. The result is that the data-valid window 12 appears to be smaller than it actually is. It also means that, in general, the strobe 36 fails to sample the data signal 122 at the center of its data-valid window 12.

Figure 8:
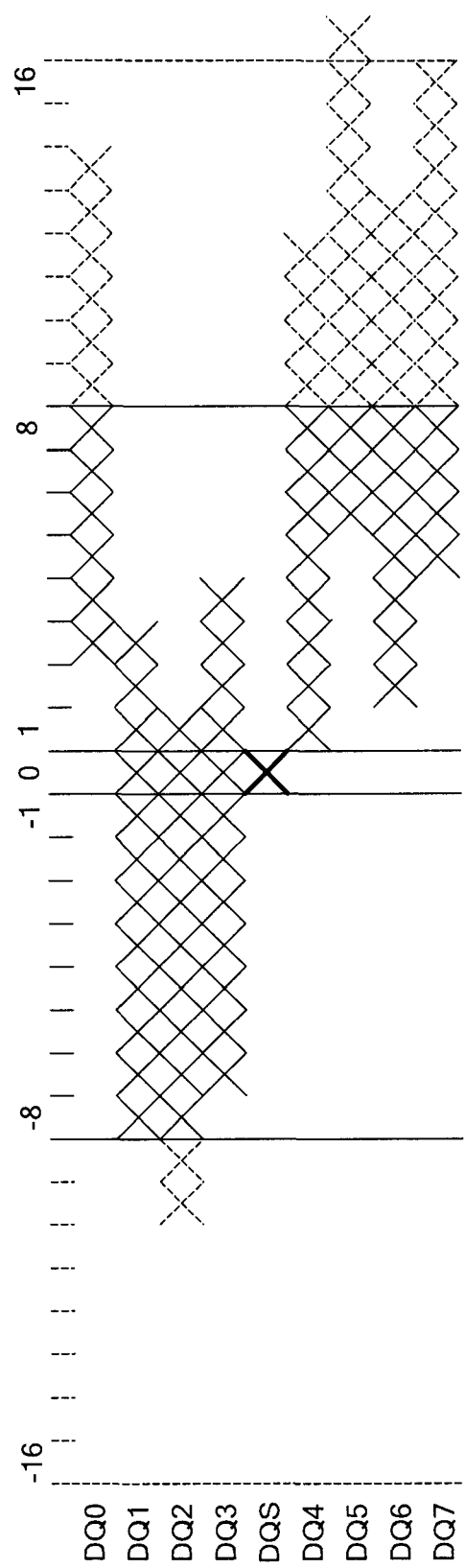
FIG. 8 shows uncompensated data signals, some of which have invisible portions.
Figure 9:
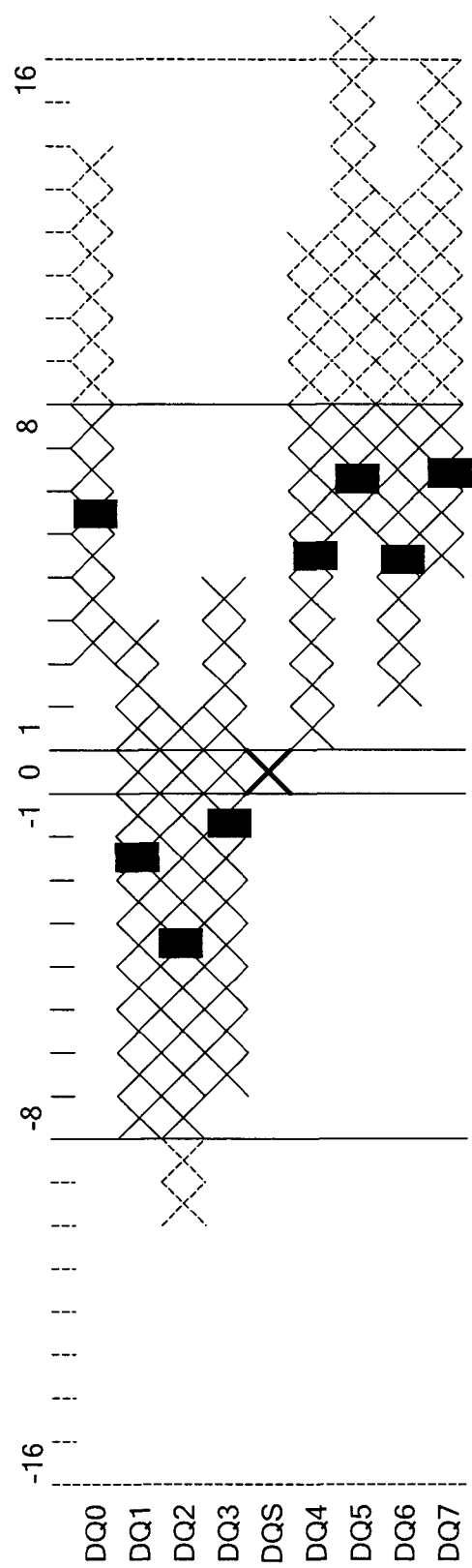
FIG. 9 shows, for each data signal in FIG. 8, the center of the valid portion based on what is visible.
Figure 10:
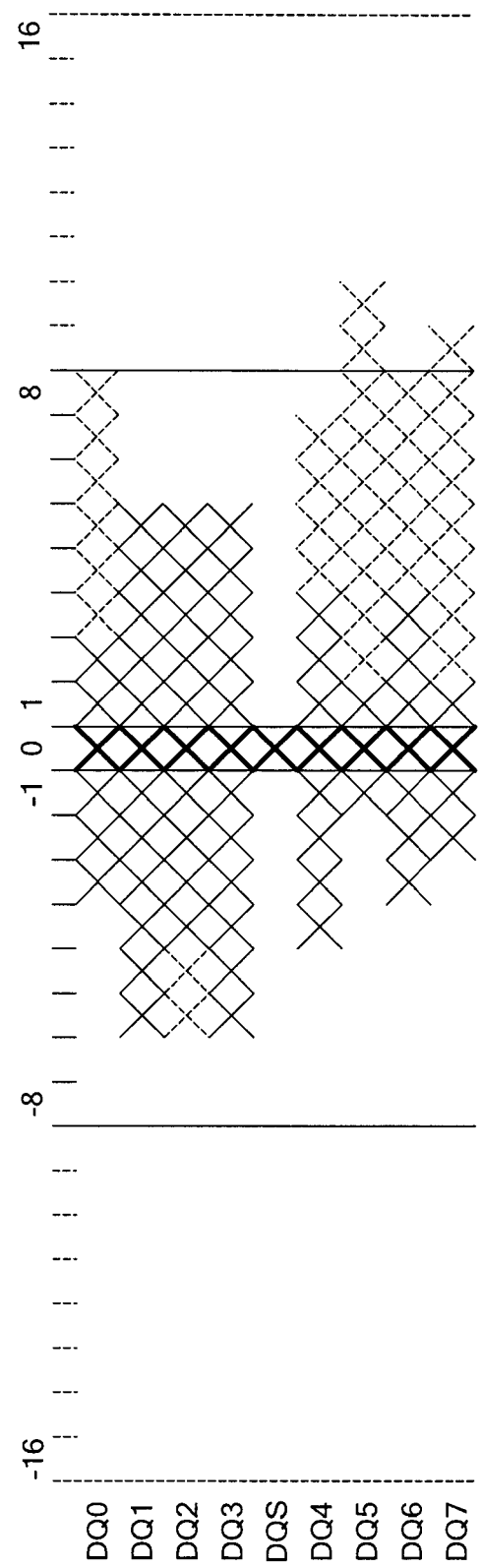
FIG. 10 shows the data signals of FIG. 8 after having had compensation-skews applied.

FIGS. 8-10 show an example of how the skews can be selected sub-optimally when portions of a data-valid window 12 fall outside the observation window 116.

FIG. 8 shows eight data signals 122, DQ0-DQ7, and the strobe 36, DQS. Compensation-skews ranging from ±8 are shown at the top of the diagram. These numbers are only for convenience. The compensation-skews could just as easily range from n to n+m for any integer n and any positive integer m, where m is the number of outputs in the delay line.

It should be noted that the extent to which data signals 122 are misaligned in FIG. 8 is greater than what would be likely to be found in practice. The data signals 122 are shown with exaggerated misalignment to illustrate the method more clearly. A more modest misalignment, which is consistent with what might encounter in practice, is shown in FIG. 16.

These compensation-skews [n, n+m] identify different stages of a delay line. As such, they are shown as dimensionless integers. In reality, they would map to particular time delays $[t_n \ldots t_{n+M}]$ where $t_i < t_j$ whenever $i < j$. Preferably, $|t_{j+1} - t_j|$ is constant.

The observation window 116 extends from a negative horizon to a positive horizon bounded by the range of compensation-skew values. By default, the strobe 36 is centered midway between the two horizons. The goal is to apply compensation-skews to each data signal 122 so that the center of the data-valid window 12 of each data signal 122 coincides with the strobe 36.

In FIG. 8, only two of the eight data signals 122, namely DQ1 and DQ3, have data-valid windows 12 that are fully contained in the observation window 116. For the data signals DQ0, and DQ4-DQ7, the leading edge falls beyond the positive horizon. For the data signal DQ2, the trailing edge falls beyond the negative horizon. This has the potential to foul an attempt to identify the center of the data-valid window 12.

FIG. 9 shows how the procedure can be misled. For each data signal, a solid rectangle shows where the algorithm believes the center of the data-valid window 12 is located. This belief is rooted in the mistaken assumption that anything outside the visible portion 47 simply does not exist.

For example, for DQ7, the algorithm has no idea that most of the data-valid window 12 actually extends beyond the positive horizon. As a result, it assumes that the data-valid window 12 for DQ7 is quite narrow and dutifully places its center at a point that is considerably to the left of where it should be. It is apparent from FIG. 7 that the only correctly placed centers of a data-valid window 12 are for those data-valid windows 12 that are completely within the observation window 116.

FIG. 10 shows the result of applying the compensation-skews. The pair of vertical parallel lines at zero skew value corresponds to where the strobe 36 samples the data signals 122. As can be seen in the figure, many of the data signals 122 are sampled near the edge of their respective data-valid windows 12.

One remedy for this difficulty is to simply increase the range of possible skews. However, this method has the disadvantage of requiring considerable hardware re-design. In addition, the component that carries out the skew, which is a delay line, will have more stages and therefore occupy more space on a chip.

Another remedy for this difficulty arises from the recognition that although the observation window 116 is finite in temporal extent, it can nevertheless be moved relative to the data signal 122 by selectively skewing the strobe 36 itself.

Thus, in this alternative method, if during the course of carrying out the procedure in FIG. 3 only one of the leading edge 118 and the trailing edge 120 of the data signal 122 can be found, then the strobe 36 is skewed to move the observation window 116 in a direction that decreases the extent of the invisible portion 45. This places a greater fraction of the data-valid window 12 inside the observation window 116. This procedure can be carried out for each data signal 122 to identify the center of the data-valid window 12 for that data signal 122.

The combination of a particular strobe-skew and a particular compensation-skew can be used to sample a particular data signal 122 at the center of its data-valid window 12. However, there will be many data signals 122 in parallel and only one strobe 36. It is almost inevitable that choosing a strobe-skew to ensure sampling a first data signal 122 at the center of its data-valid window 12 will result in sampling a second data signal 122 further from the center of its data-valid window 12. Therefore, it will not be possible to select the optimal strobe-skew for each data signal 122. Instead, the strobe-skew is optimized across all data signals 122.

The variability of the strobe-skew provides another degree of freedom for the procedure described in connection with FIG. 3. In addition to an optimal compensation vector as discussed in connection with FIG. 4, there is now an optimal strobe-skew associated with the optimal compensation vector.

Preferably, the range of strobe-skews for the strobe 36 is the same as the range of compensation-skews for the data signals 122. This will permit the same kind of delay line to be used for both. Such an implementation is used in FIG. 11, in which both the data skew and the strobe-skew have a ±8 range. This effectively results in a ±16 wide horizon.

Figure 11:
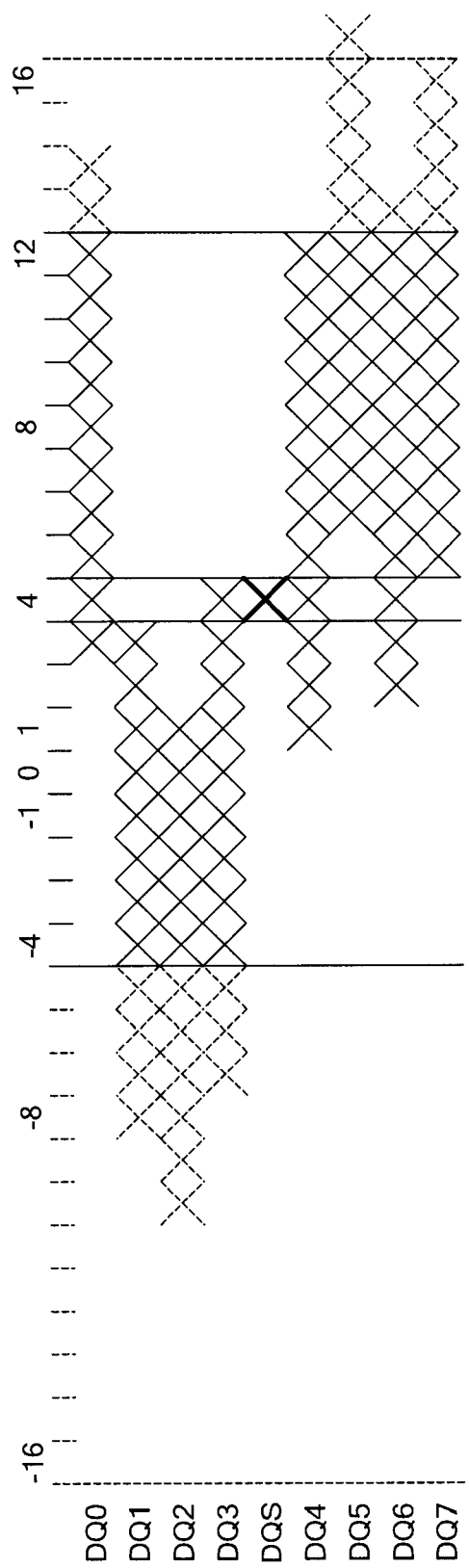
FIG. 11 shows uncompensated data signals, with a strobe having been skewed to maximize the extents within the visible range.
Figure 12:
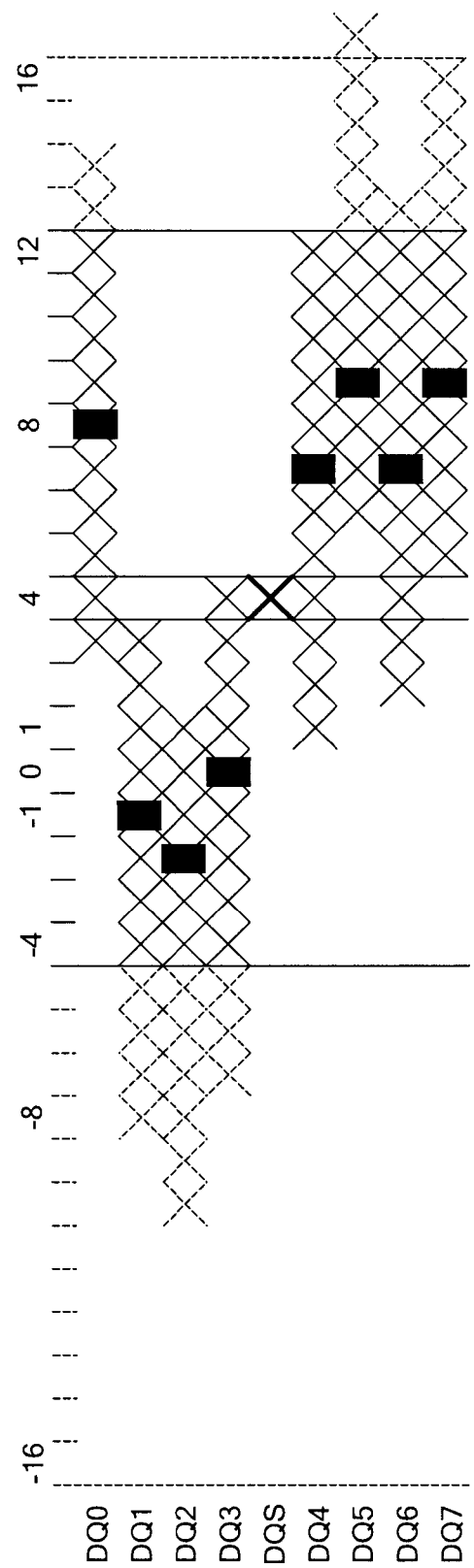
FIG. 12 shows, for each data signal in FIG. 11, the center of the valid portion based on what is visible.

The strobe 36 is skewed until the sum over the lengths of all visible portions 47 of all data-valid windows 12 is maximized. For the particular example shown, this corresponds to a strobe-skew of +4, for which the visible range is shown in FIG. 11. For each data signal 122, the procedure then identifies the center of the data-valid window 12. These centers are marked in FIG. 12. Upon application of the relevant compensation-skews, the result is as shown in FIG. 13.

Figure 13:
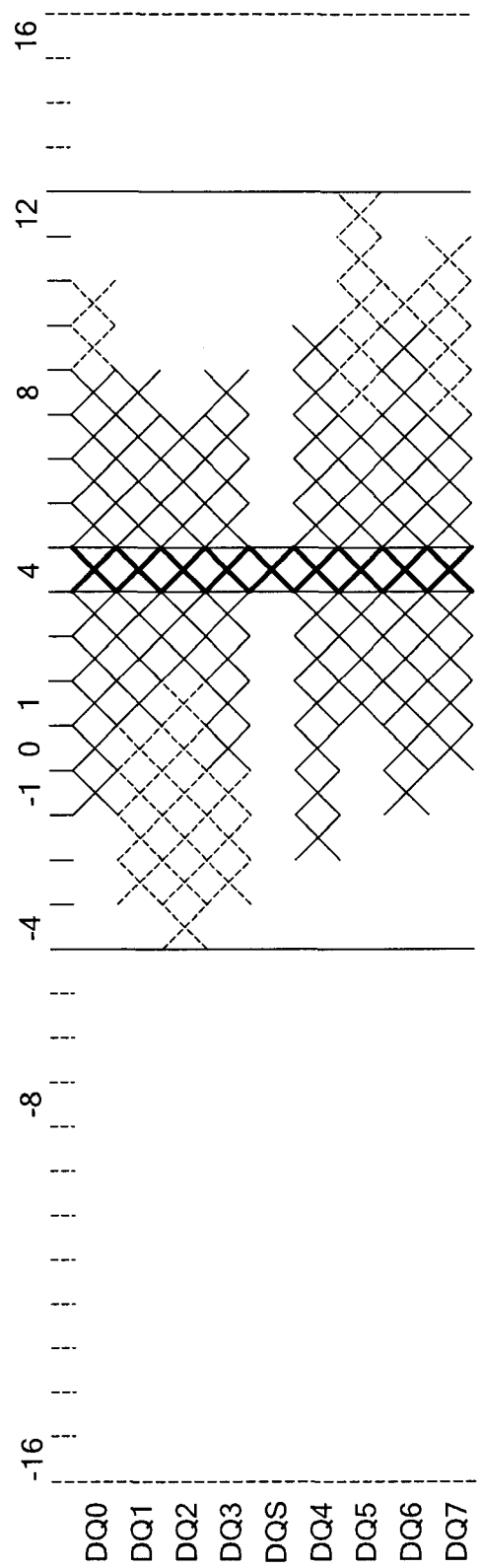
FIG. 13 shows the data signals of FIG. 11 after having had compensation-skews applied.

As is apparent from FIG. 13, it is still not the case that each data signal 122 has been sampled at the center of its data-valid window 12. However, the overall error is considerably lower than it was in FIG. 10.

Figure 14:
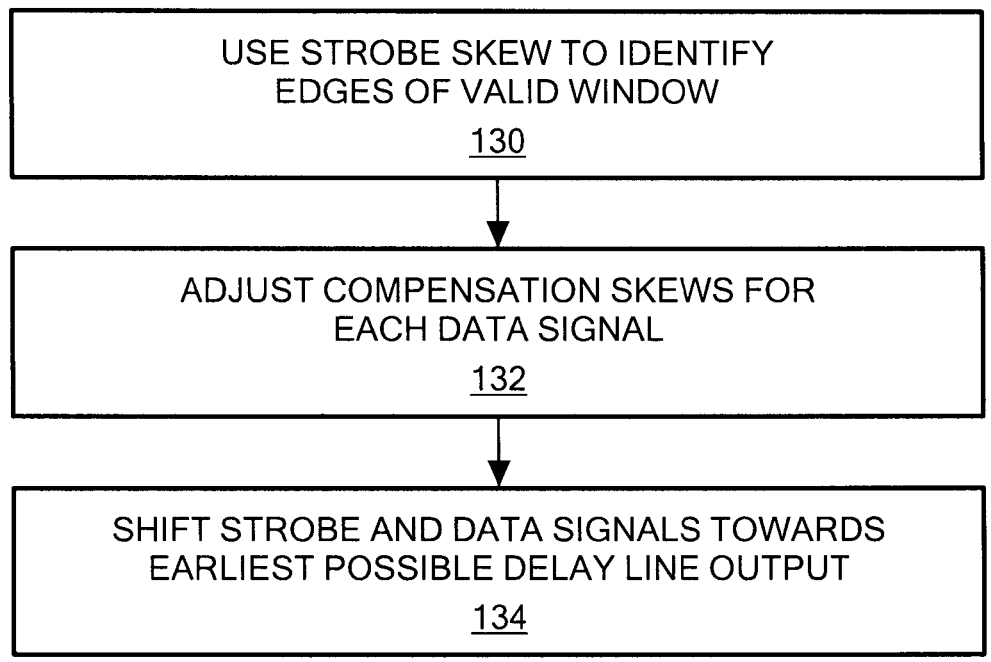
FIG. 14 illustrates a method for aligning the data signals by applying compensation-skews and a variable strobe-skew.

As shown in FIG. 14, a method of optimizing the sampling of the data signal 122 using a variable strobe-skew typically includes identifying the edges of the data-valid window 12 (step 130). This is best carried out by adjusting the strobe-skew, and seeing if the adjustment reveals either a leading edge 118 or a trailing edge 120 of a data window 122.

The procedure for ascertaining an extent of a data-valid window 12 can be carried out by stepping through selected values of strobe-skew, and, for each such value, sweeping across all data signals 122 to see if a leading or trailing edge 118, 120 can be detected.

In some embodiments, the set of selected values of strobe-skew is the set of all possible values of strobe-skew, which is {m . . . m+n}. In other embodiments, the set of selected values of strobe-skew is a proper subset of the set, {m . . . m+n}, of all possible values of strobe-skew. In the special case in which the range of compensation-skews for each data signal 122 and the range of strobe-skews are identical, the set of selected values consists of only the first and last elements in an ordered set of strobe-skews. In particular, if the ordered set of strobe-skews is the set [m . . . m+n] then the selected subset will be the two-element set {m, m+n}.

Figure 15:
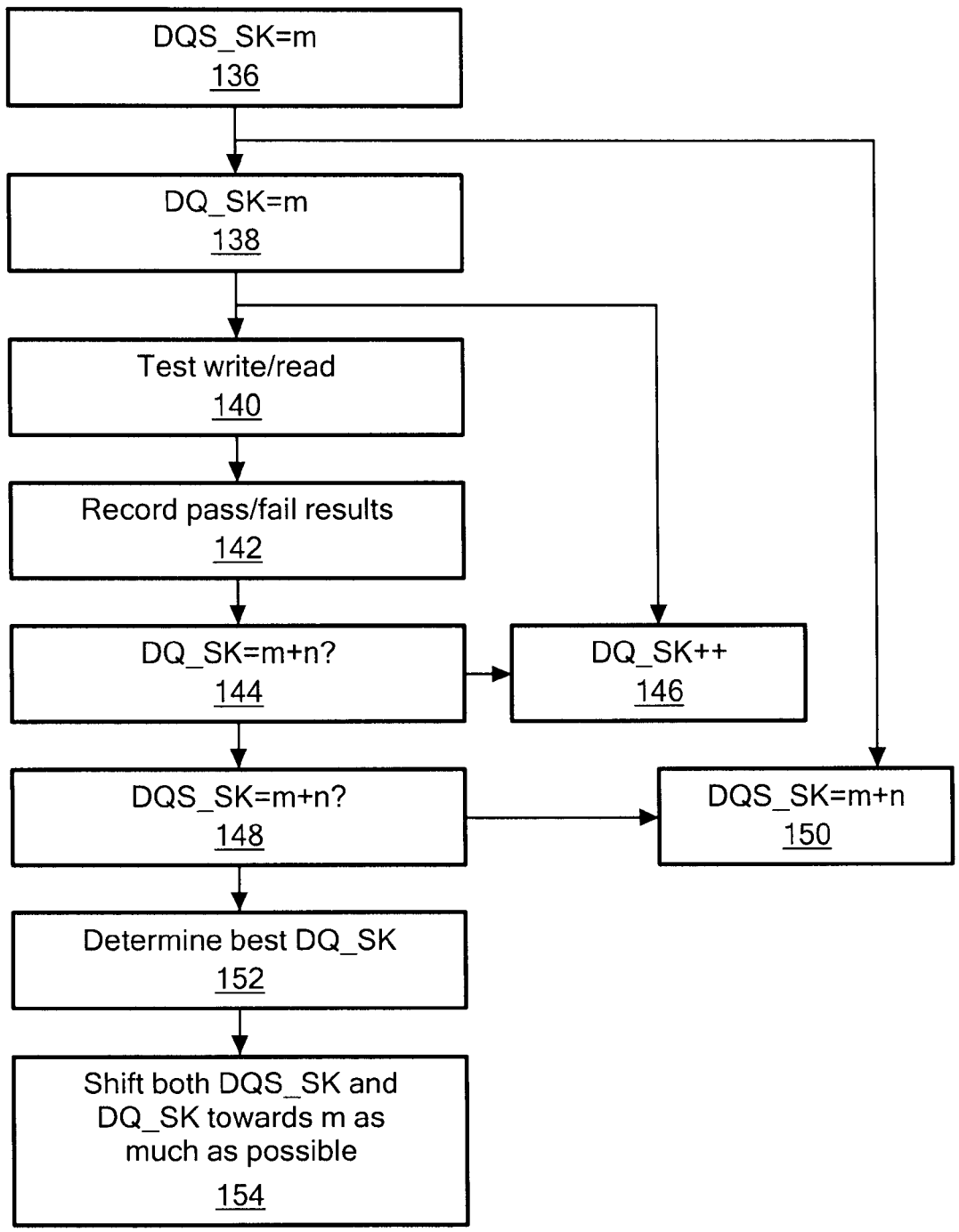
FIG. 15 illustrates details for one practice of the method illustrated in FIG. 14.

FIG. 15 illustrates the procedure for the case in which the range of compensation-skews for each data signal 122 is the same as the range of strobe-skews.

Once the leading and trailing edges 118, 120 of each data signal 122 have been found, it is possible to adjust the compensation-skews of each data signal 122 so that the strobe 36 samples each data signal 122 as close to the center of its data-valid window 12 as possible (step 132).

As a data signal 122 proceeds along the delay line from the first delay line output, at the beginning of the delay line, to the last delay line output, at the end of the delay line, it tends to become distorted. This distortion arises in part from imperfections in the fabrication process. Among other things, this process mismatch can causes an offset in duty cycle, for example, and it becomes worse with more delay stages being accumulated together. As a result of duty cycle distortion, the width of the data-valid window 12 will tend to change at different stages of the delay line. For this reason, it is desirable to sample a data signal as early as possible on the delay line. As a result, it is useful to shift the strobe-skew and the compensation-skews towards the beginning of the delay line (step 134).

In particular, if the range of strobe-skews is [m, m+n], and at the end of the adjustment step (step 132) the strobe-skew is set to k, it is desirable to set the strobe-skew to k-j, where j is a positive integer, and to subtract j from each element of the compensation vector. The value of j is as large as possible consistent with the constraint that because the temporal windows are of finite extent, one may eventually encounter a value of j such that the data signal 122 can no longer be shifted.

FIG. 15 shows the procedure of FIG. 14 in more detail for the special case in which the delay stages are identified by integers between m and m+n inclusive for both the strobe-skew and the compensation-skews, where m is the delay stage closest to the beginning of the delay line and m+n is the delay stage that is furthest from the beginning of the delay line, and in which delays monotonically increases as the delay line stage goes from m to m+n.

The procedure begins with the strobe-skew and the compensation-skew both being set to the values that give the smallest delay, (step 136, step 138). A test is then carried out by writing to memory and reading back from memory (step 140). The result of the test is then recorded (step 142). At the end of the test, if the compensation-skew has not reached its maximum value (step 144), the compensation-skew is incremented (step 146) and the test is repeated for the new value of compensation-skew (step 140). This creates an inner loop, the purpose of which is to march through all the compensation-skews for a fixed strobe-skew.

If the compensation-skew has already reached its maximum value (step 148), the strobe-skew is incremented (step 150). This creates an outer loop, the purpose of which is to march through all values of the strobe-skew.

Once both loops have run their course, the recorded results are inspected and a determination of the optimal strobe-skew and compensation-skew is carried out (step 152).

In an optional step, which is intended to minimize the effect of duty-cycle distortion, the data signals 122 and the strobe are moved together as a unit so that sampling of the data signals 122 occurs as close to the beginning of their respective delay lines as possible. This is implemented by decrementing the strobe-skew and all the compensation-skews together to cause the data signals and the strobe to move as a unit towards the beginning of the delay line (step 154). The particular decrement is limited by the fact that there may be a data signal that, as a result of the finite length of a delay line, cannot have its compensation-skew decremented beyond a certain point.

FIG. 16-19 show an example in which the method described in FIG. 15 is carried out.

The procedure begins with the distribution of data signals shown in FIG. 16. This represents a distribution that is more likely to be found in practice than the more exaggerated distribution found in FIG. 8.

By FIG. 17, after execution of step 152 in FIG. 15, the procedure has identified the center of each data signal. These centers are marked in FIG. 17.

Figure 18:
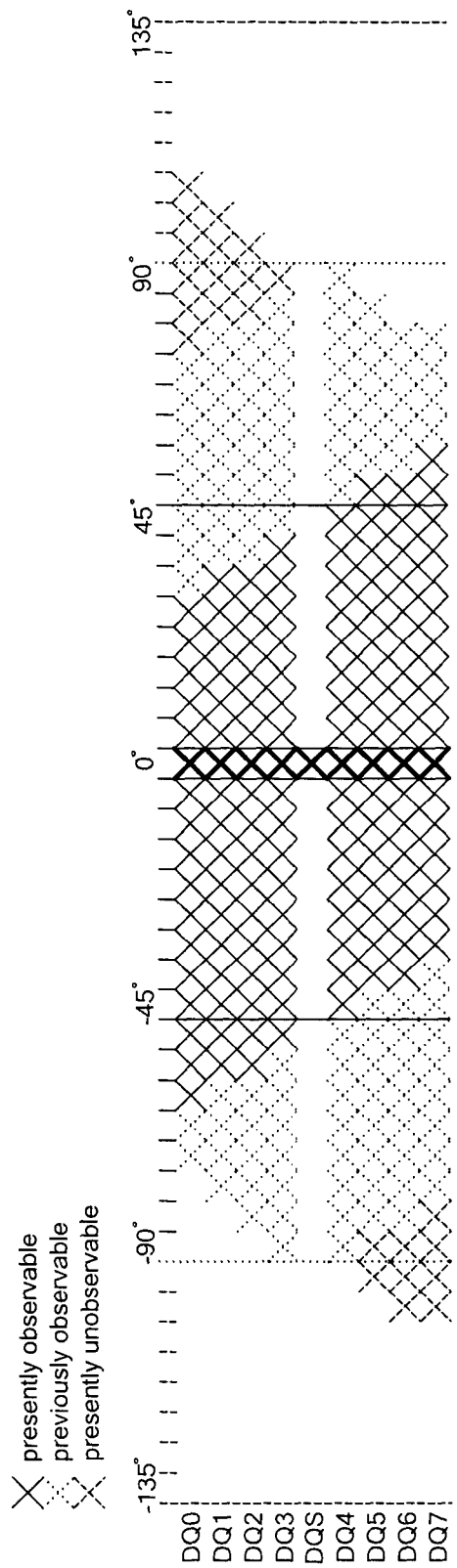
FIG. 18 shows the data signals of FIG. 16 after having had compensation-skews applied.

FIG. 18 shows the data signals after the relevant compensation-skew has been applied to each one. Each data signal is being sampled very close to the center of its data-valid window 12 as required. The absolute center is still not found due to the limited shift range of the delay lines. However, the sampling of the data signal would occur near the middle of the delay line. As discussed above, it is preferable to carry out the sampling near the beginning of the delay line to reduce the accumulated effect from duty-cycle distortion.

Figure 19:
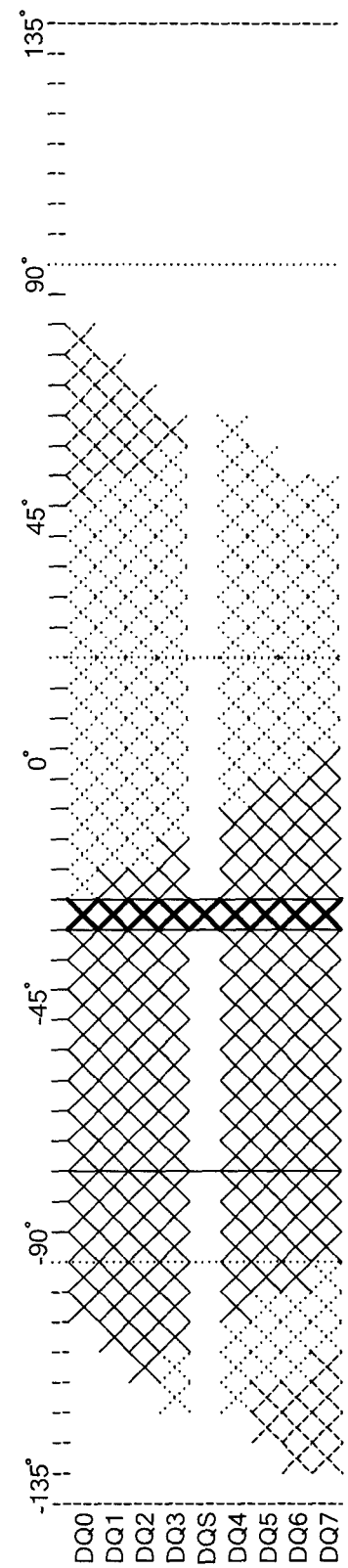
FIG. 19 shows the data signals of FIG. 18 after having been shifted for sampling closer to the beginnings of their respective delay lines.

In FIG. 19, following execution of step 154 in FIG. 15, the data signals 122 and the strobe 36 have all been moved together as a unit towards the beginnings of the relevant delay lines. However, it is apparent from inspection of FIG. 19 that DQ0 cannot be shifted towards the beginning of the delay line any further than what is shown.

Figure 5:
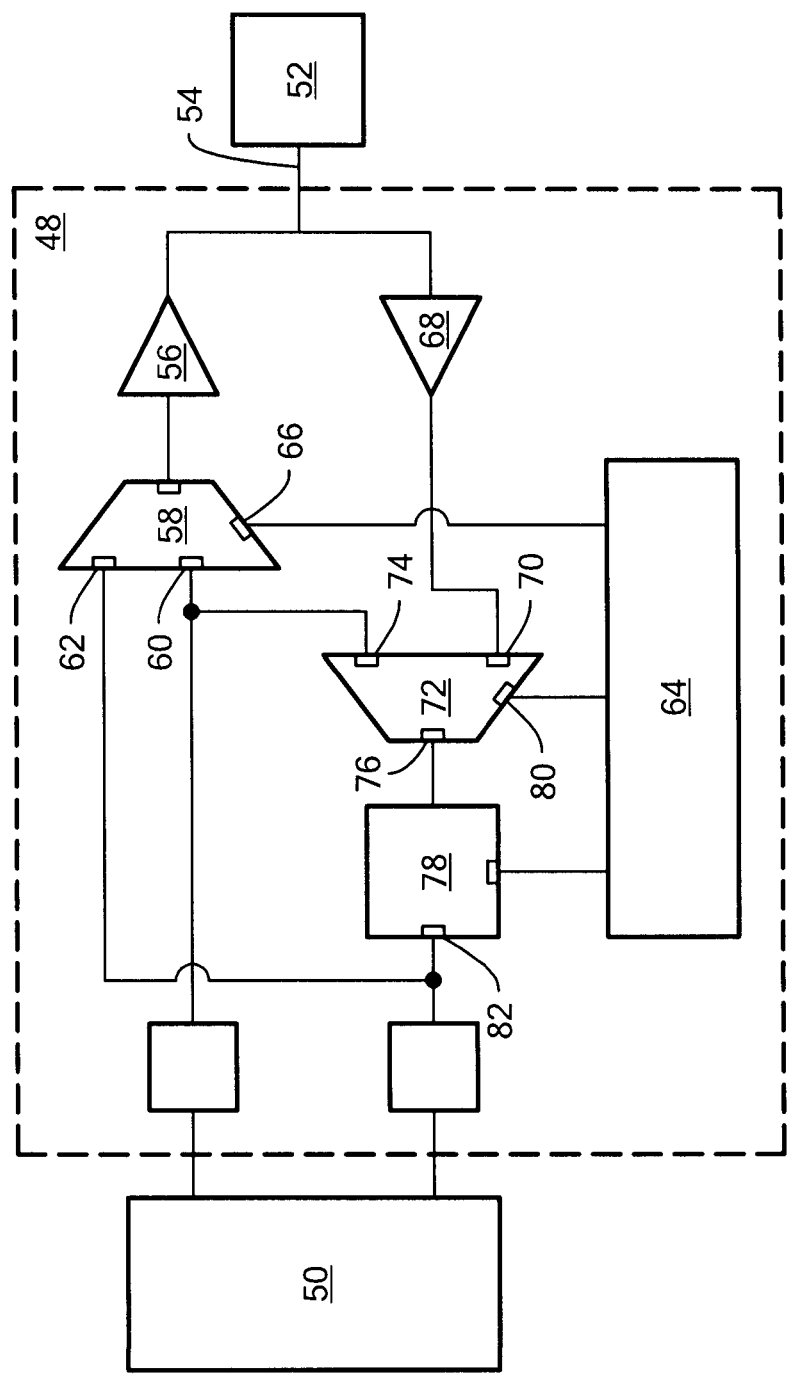
FIG. 5 shows a circuit for providing a strobe according to the procedure set forth in FIG. 2.

FIG. 5 shows a strobe-communication circuit 48 for communicating strobes between a memory controller 50 and a memory 52 via a bidirectional strobe line 54. The particular circuit shown has two modes of operation: a read mode, in which it receives a read-strobe from the memory 52, and a write mode, in which it sends a write-strobe to the memory 52.

The write mode can be a conventional write-mode or a skewed write-mode. In the conventional write-mode, the write-strobe is delayed by a nominal amount that is selected in an attempt to sample at the midpoint of a data-valid window 12. A write-strobe having this property will be referred to as a "nominal write-strobe." In the skewed write-mode, the write-strobe is first passed through a de-skewer that delays it by some predetermined amount that depends on the minimum and maximum delay of the de-skewer. For example, the predetermined amount can be set to be as close as possible to one half of a difference between the minimum and maximum delays, or can be set to an amount that also depends on the inherent skews of the data lines, as described above in the procedure for using a variable strobe-skew. This kind of write strobe will be referred to as a "skewed write-strobe."

The strobe-communication circuit 48 includes a transmitter 56 for placing a write-strobe on the strobe line 54. This write-strobe is to be provided to the memory 52 during a write operation.

A first multiplexer 58 has an output connected to the transmitter 56. The output of the first multiplexer 58 provides the write-strobe that is to be placed on the strobe line 54 by the transmitter 56. The transmitter 56 is, in some embodiments, configured to convert logic levels used by the memory controller 50 into logic levels used by the memory 52.

The first multiplexer 58 has first and second inputs 60, 62 for receiving two different versions of a write-strobe. The first input 60 receives a nominal write-strobe. The second input 62 receives a skewed write-strobe. The choice of whether to place the skewed write-strobe or the nominal write-strobe on the strobe line 54 is made by control logic 64 connected to a control input 66 of the first multiplexer 58.

The strobe-communication circuit 48 further includes a receiver 68 for receiving a read-strobe on the strobe line 54 during a read operation. The receiver 68 connects to a first input 70 of a second multiplexer 72, a second input 74 of which receives the nominal write-strobe. The receiver 68 is, in some embodiments, configured to convert logic levels used by the memory 52 into logic levels used by the memory controller 50.

The second multiplexer 72 has an output 76 that leads to a de-skewer 78. Thus, the de-skewer 78 can receive either the nominal write-strobe or a read-strobe. The choice between these two is made by a signal provided by the control logic 64 to a control input 80 of the second multiplexer 72.

When being used in connection with writing into memory, a de-skewer output 82, or the second input of the first multiplexer 58, provides a skewed strobe to the second input 62 of the first multiplexer 58. On the other hand, when being used in connection with reading from memory, the de-skewer output 82 provides the skewed strobe to whatever entity would normally use the read-strobe. The amount of skew may be fixed, or may be tuned based on a range of skew values determined for the data signals, as described below with reference to FIG. 6. In some embodiments, the amount of skew is fixed halfway between the minimum and maximum possible skews provided by the de-skewer 78.

In those embodiments of delay lines that include a zero-delay stage, the data de-skewer 78 has a delay stage that corresponds to zero delay. This tap can be used when operating in read-mode to effectively bypass the data de-skewer 78. Another way to implement this is to provide another multiplexer that has a first input connected to an output of the data de-skewer 78 and a second input connected to the input of the data de-skewer 78. A selector can then be used to select a signal that bypasses the data de-skewer 78 altogether.

In the case where a strobe de-skewer is variable, the amount of skew that can be compensated between the strobe signal and the data signals is increased. As shown in FIG. 11, if the DQ signals show an offset from the DQS signal as a group, the DQS signal could be moved closer to the group of DQ signals in addition to the DQ signals moving closer to the DQS signal. This doubles the skew compensation range for grouped DQ signals.

When carrying out a read operation, the receiver 68 is active and the transmitter 56 is inactive. The control logic 64 selects the first input 70 of the second multiplexer 72. As a result, the read-strobe passes through the de-skewer 78, which then delays it by some predetermined amount. The skewed read-strobe also happens to be provided to the second input of the first multiplexer 58. However, since the transmitter 56 is inactive, this has no effect.

When carrying out a normal write-operation, the receiver 68 is inactive and the transmitter 56 is active. The control logic 64 selects the first input 60 of the first multiplexer 58. As a result, the nominal write-strobe is placed on the strobe line 54.

When carrying out a skewed write-operation, the receiver 68 is inactive and the transmitter 56 is active. The control logic 64 selects the second input 62 of the first multiplexer 58 and the second input 74 of the second multiplexer 72. This means that the signal placed on the strobe line 54 will be the output of the de-skewer 78. As it turns out, since the second input 74 receives the nominal write-strobe, the output of the de-skewer 78 will be a skewed write-strobe. As a result, a skewed write-strobe is placed on the strobe line 54.

The strobe communication circuit 48 thus offers the advantage of re-using the de-skewer 78 for both read and write operations. This saves considerable die space and reduces overall power consumption.

Figure 6:
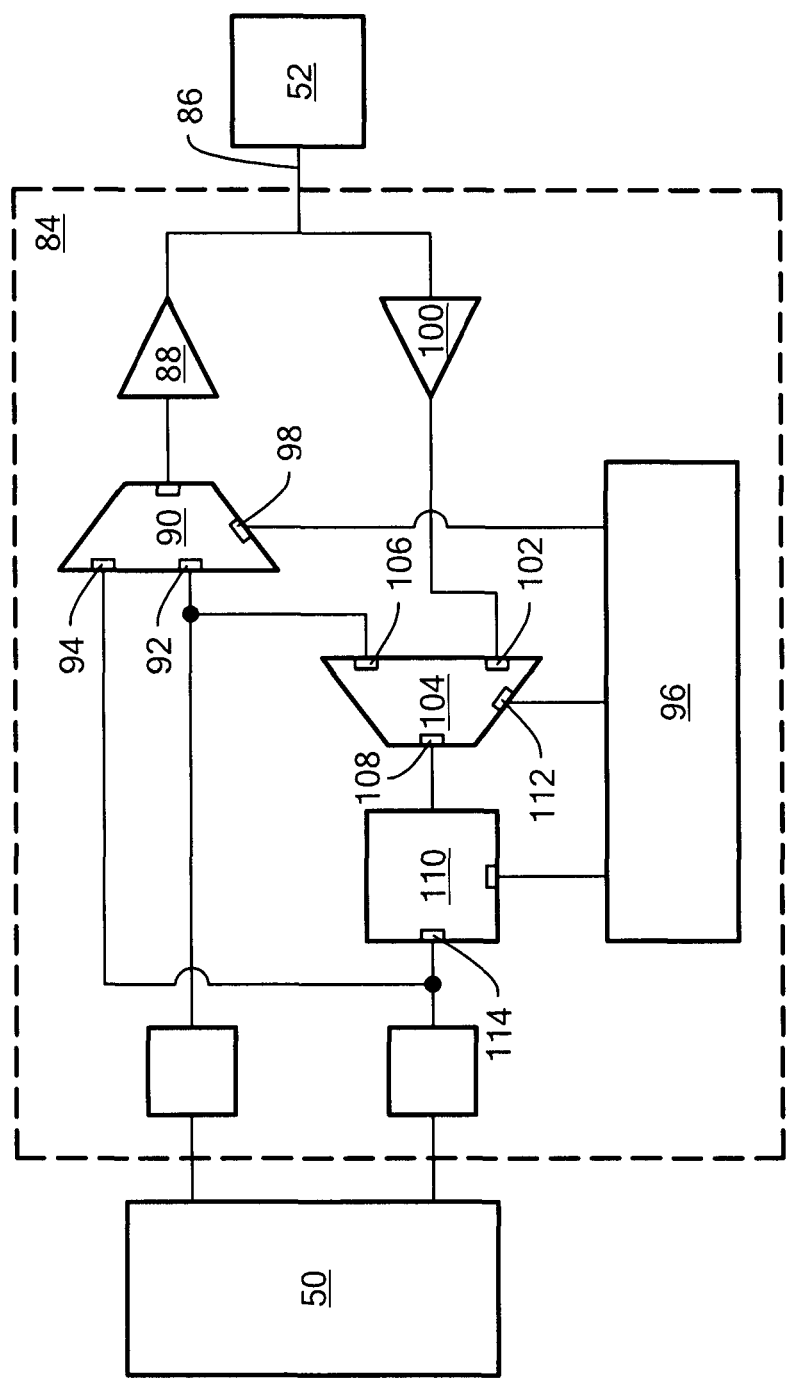
FIG. 6 shows a circuit for providing data signals according to the procedure set forth in FIG. 2.

FIG. 6 shows one of eight data-communication circuits 84 for communicating data between a memory controller 50 and a memory 52 via a bidirectional data line 86. The particular circuit shown has two modes of operation: a read mode, in which it receives a data bit from the memory 52, and a write mode, in which it sends a data bit to the memory 52.

The write mode can be a conventional write-mode or a skewed write-mode. In the conventional write-mode, the data bit to be written is not delayed on purpose. A data bit having this property will be referred to as a "nominal data-bit." In the skewed write-mode, a de-skewer has delayed the data bit to be written in an attempt to maximize the data-valid window 12 that can be sampled by the strobe. This kind of data bit will be referred to as a "skewed data bit."

The data-communication circuit 84 includes a transmitter 88 for placing a data bit on the data line 86. This data bit is to be provided to the memory 52 during a write operation. The transmitter 88 is, in some embodiments, configured to convert logic levels used by the memory controller 50 into logic levels used by the memory 52.

A first multiplexer 90 has an output connected to the transmitter 88. The output of the first multiplexer 90 provides the data bit that is to be placed on the data line 86 by the transmitter 88.

The first multiplexer 90 has first and second inputs 92, 94 for receiving two different versions of a data bit. The first input 92 receives a nominal data-bit. The second input 94 receives a skewed data-bit. The choice of whether to place the skewed data-bit or the nominal data-bit on the data line 86 is made by control logic 96 connected to a control input 98 of the first multiplexer 90.

The data-communication circuit 84 further includes a receiver 100 for receiving a data bit on the data line 86 during a read operation. The receiver 100 connects to a first input 102 of a second multiplexer 104, a second input 106 of which receives the nominal data-bit. The receiver 100 is, in some embodiments, configured to convert logic levels used by the memory 52 into logic levels used by the memory controller 50.

The second multiplexer 104 has an output 108 that leads to a de-skewer 110. Thus, the de-skewer 110 can receive either the nominal data-bit that is to be written into memory or a data bit that has been read from memory. The choice between these two is made by a signal provided by the control logic 96 to a control input 112 of the second multiplexer 104.

When used in connection with writing data into memory, a de-skewer output 114 provides a skewed data signal to the second input 94 of the first multiplexer 90. When used in connection with reading data from memory, the de-skewer output 114 provides the skewed data signal to whatever entity requested the data to be read.

As discussed in connection with FIG. 2, the amount of skew is determined during the training procedure 16, which may be initially performed before the operating procedure 18. Some practices have separate read-training and write-training procedures. During the read-training procedure, optimal compensation-skews for use in connection with reading from memory 52 are determined. During the write-training procedure, optimal compensation-skews to be used in connection with writing into memory 52 are determined.

Preferably, the read-training procedure is performed first, followed by the write-training procedure. This means that the optimal compensation-skews derived from the read-training procedure can be used for reading values during the comparison step 26. Thus, results of the write-training procedure depend at least in part on results of the read-training procedure.

Some implementations have other differences between read-training and write-training. For example, the write-training procedure 16 described above is performed based on a round-trip comparison between a value written to memory 52 and a value read from memory 52. In contrast, the read-training procedure can be performed by simply making use of any data pattern available from the memory 52. This is because the data-communication circuit 84 does not need to write a value and then read it back in for comparison. Instead, read-training can be carried out by reading the data pattern from the memory 52 and locating the timing of the actual leading-transition interval 10 and trailing-transition interval 14 for each bit over the compensation range of the delay line. This can be done by oversampling the data signal to locate leading and trailing edges of a single bit, and use the specific locations of those edges to determine the optimal compensation-skew values. The oversampling can be performed based on the incoming strobe signal corresponding to the data signal. For example, the oversampling may include sampling using multiple time-shifted versions of the strobe signal, as described in more detail in U.S. patent application Ser. No. 14/046,879.

In some implementations, the read-training is initially performed before normal operation begins, using a pre-defined test data pattern written into the memory, or provided by the memory as a built-in pattern. Additionally, the read-training procedure can also be carried out during normal operation of the memory using any data pattern that happens to be read from the data lines. An advantage of being able to carry out read-training during normal operation by making use of any data pattern is the ability to periodically re-train during operation without needing to suspend normal operations between the memory controller 50 and the memory 52. This re-training may be useful to obtain updated compensation-skew values that have changed due to a temperature and voltage change, for example.

When carrying out a read operation, the receiver 100 is active and the transmitter 88 is inactive. The control logic 96 selects the first input 102 of the second multiplexer 104. As a result, the data bit that has just been read passes through the de-skewer 110, which then delays it by some predetermined amount. The skewed data bit that has just been read also happens to be provided to the second input of the first multiplexer 90. However, since the transmitter 88 is inactive, this has no effect.

When carrying out a normal write-operation, the receiver 100 is inactive and the transmitter 88 is active. The control logic 96 selects the first input 92 of the first multiplexer 90. As a result, the nominal data-bit is placed on the data line 86.

When carrying out a skewed write-operation, the receiver 100 is inactive and the transmitter 88 is active. The control logic 96 selects the second input 94 of the first multiplexer 90 and the second input 106 of the second multiplexer 104. This means that the signal placed on the data line 86 will be the output of the de-skewer 110. As it turns out, since the second input 92 receives the nominal data-bit, the output of the de-skewer 110 will be a skewed data-bit. As a result, a skewed data-bit is placed on the data line 86.

The data-communication circuit 84 thus offers the advantage of re-using the de-skewer 110 for both read and write operations. This saves considerable die space and reduces overall power consumption.

The control logic 96 also has the ability to control what compensation-skews are used for read operations and write operations. In a compensation re-use mode, the control logic 96 selects the compensation-skews determined during the read-training procedure for both read operations and write operations. Because much of the route used by the data lines as they traverse the hardware between the memory controller 50 and the memory 52 is bidirectional, path length difference for reading and writing will be substantially identical. This means that the compensation-skews for reading can also provide improved setup and hold time margin when they are re-used for writing. There may be some difference between the optimal compensation-skews for reading and writing, which come from differences in the circuitry of the data lines that is not in common for both transmission and reception, but the reading compensation-skews may be adequate for writing in some cases.

Having described the invention, and a preferred embodiment thereof, what is claimed as new, and secured by letters patent is:

1. An apparatus for controlling a memory, said apparatus comprising: a memory controller, a data interface that interfaces with data lines that connect said memory controller to said memory, a plurality of data de-skewers, each of said data de-skewers being associated with a corresponding one of said data lines, a strobe interface that interfaces with a strobe line that connects said memory controller to said memory, and a strobe de-skewer that is in communication with said strobe line, wherein each of said data lines carries a data signal, wherein said data interface is in data communication with each of said data lines, wherein said strobe interface is configured to apply a timing signal to said strobe line, wherein each of said data de-skewers is configured to operate in a write mode, in which a bit is to be written to said memory, and in a read mode, in which a bit is to be read from said memory, wherein said data de-skewer that corresponds to said data line is configured to apply a compensation skew to a data signal that is carried by said data line, wherein when said data de-skewer is being operated in said write mode, said data signal represents a bit that is to be written to said memory, and wherein when said data de-skewer is being operated in said read mode, said data signal represents a bit that has been read from said memory, wherein each of said data lines has an inherent skew, wherein each of said data de-skewers applies a compensation-skew to a data signal that is being carried by a data line with which said data de-skewer corresponds, and wherein said strobe de-skewer is configured to skew said timing signal by an amount that is selected to be one of less than and equal to a maximum delay of said strobe de-skewer and one of greater than and equal to a minimum delay of said strobe de-skewer, and said strobe-deskewer is configured to skew said timing signal by a timing-signal skew that has been selected to reduce a collective sampling error that is defined based at least in part on: (1) an extent to which each of said data signals is sampled at a center of a data-valid window thereof, and (2) an extent to which at least one of said data signals has a compensation skew applied through one or more delay stages towards a beginning of a delay line.

2. The apparatus of claim 1, wherein said strobe de-skewer is configured to skew said timing signal by a timing-signal skew that depends at least in part on said inherent skews.

3. The apparatus of claim 1, wherein said strobe de-skewer is configured to skew said timing signal by a timing-signal skew selected to be as close as possible to one half of a difference between said maximum delay of said de-skewer and said minimum delay of said de-skewer.

4. The apparatus of claim 1, wherein said strobe de-skewer is configured to skew said timing signal by a timing-signal skew selected to be equal to one half of a difference between said maximum delay of said strobe de-skewer and said minimum delay of said strobe de-skewer.

5. The apparatus of claim 1, wherein said data lines comprise a first data line, wherein said first data line comprises a first data de-skewer, wherein said first data de-skewer defines a first observation window, wherein said first data line carries a first data signal, wherein said first data signal has a first data-valid window, and wherein said strobe de-skewer is configured to skew said timing signal by a timing-signal skew that has been selected based at least in part on an extent to which said first data-valid window extends into said first observation window.

6. The apparatus of claim 1, wherein said data lines comprise a first data line and a second data line, wherein said first data line carries a first data signal, wherein said first data signal has a first data-valid window, wherein said first data-valid window has a first data-valid-window center, wherein said first data line is sampled at a first sample point, wherein a distance between said first sample point and said first data-valid-window center defines a first offset, wherein said second data line carries a second data signal, wherein said second data signal has a second data-valid window, wherein said second data-valid window has a second data-valid-window center, wherein said second data line is sampled at a second sample point, wherein a distance between said second sample point and said second data-valid-window center defines a second offset, and wherein said collective sampling error is a function of an extent to which each of said data signals is sampled at a center of a data-valid window thereof.

7. The apparatus of claim 1, wherein said strobe de-skewer is configured to skew said timing signal by a timing-signal skew that has been selected based at least in part on said compensation-skews applied to each of said data signals by said data de-skewers.

8. The apparatus of claim 1, wherein said strobe de-skewer is configured to skew said timing signal by a timing-signal skew that has been selected based at least in part on a failure to detect an edge, wherein said edge is an edge that is selected from the group consisting of a trailing edge of a data signal, and a leading edge of said data signal.

9. The apparatus of claim 1, wherein said strobe de-skewer is configured to skew said timing signal by a timing-signal skew that has been selected based at least in part on a particular set of compensation skews that have been selected for said data de-skewers, wherein said particular set of skews that have been selected for said data de-skewers were selected to cause each data signal to be sampled as closely as possible to a first delay stage of a data de-skewer associated with said data signal subject to the constraint that no data signal be skewed far enough to cause a data-valid window thereof to leave an observation window of a data de-skewer.

10. A method of controlling a memory, said method comprising: receiving a plurality of data signals on corresponding data lines, each of which has an inherent skew, selecting compensation skews, each of which corresponds to one of said data lines, applying each of said compensation skews to a data signal that is being carried by a corresponding one of said data lines, wherein said data signal is a bit that has been read from said data line when operating in a read mode, and wherein said data signal is a bit that is to be written to said data line when operating in a write mode, from a range that extends from a maximum delay of a strobe de-skewer to a minimum delay of said strobe de-skewer, selecting a timing-signal skew to apply to said timing signal, and skewing said timing signal by said timing-signal skew; wherein skewing said timing signal comprises skewing said timing signal by a timing-signal skew that has been selected to reduce a collective sampling error that is defined based at least in part on: (1) an extent to which each of said data signals is sampled at a center of a data-valid window thereof, and (2) an extent to which at least one of said data signals has a compensation skew applied through one or more delay stages towards a beginning of a delay line.

11. The method of claim 10, wherein selecting a timing-signal skew to apply to said timing signal comprises selecting a timing-signal skew that depends at least in part on said inherent skews.

12. The method of claim 10, wherein selecting a timing-signal skew to apply to said timing signal comprises selecting a timing-signal skew to be as close as possible to one half of a difference between said maximum delay of said de-skewer and said minimum delay of said de-skewer.

13. The method of claim 1, wherein selecting a timing-signal skew to apply to said timing signal comprises selecting a timing-signal skew to be equal to one half of a difference between said maximum delay of said strobe de-skewer and said minimum delay of said strobe de-skewer.

14. The method of claim 10, wherein selecting a timing-signal skew to apply to said timing signal comprises selecting said timing-signal skew based at least in part on an extent to which a first data-valid window of a first data signal from said plurality of data signals extends into a first observation window of a first data de-skewer on a data line that carries said first data signal.

15. The method of claim 10, wherein skewing said timing signal by said timing-signal skew comprises skewing said timing-signal by a timing-signal skew that has been selected based at least in part on a particular optimal compensation vector.

16. The method of claim 10, wherein selecting a timing-signal skew to apply to said timing signal comprises selecting said timing-signal skew based at least in part on a failure to detect an edge, wherein said edge is selected from the group consisting of a trailing edge of a data signal and a leading edge of a data signal.

17. The method of claim 10, wherein selecting compensation skews comprises selecting said compensation skews to cause each data signal to be sampled as closely as possible to a first delay stage of a data de-skewer associated with said data signal subject to the constraint that no data signal be skewed to an extent that causes a data-valid window thereof to leave an observation window of said data de-skewer, and wherein selecting a timing-signal skew to apply to said timing signal comprises selecting said timing-signal skew based at least in part on said particular set of skews.

* * * * *